United States Patent
Wong et al.

(10) Patent No.: US 9,012,826 B2
(45) Date of Patent: Apr. 21, 2015

(54) OPTOCOUPLER WITH MULTIPLE PHOTODETECTORS AND IMPROVED FEEDBACK CONTROL OF LED

(75) Inventors: Chee Mang Wong, Singapore (SG); Kok Chien Lau, Singapore (SG); Chin Hian Sia, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 679 days.

(21) Appl. No.: 13/342,227

(22) Filed: Jan. 3, 2012

(65) Prior Publication Data
US 2013/0168531 A1  Jul. 4, 2013

(51) Int. Cl.
| G01J 1/42 | (2006.01) |
| G01J 1/44 | (2006.01) |
| H04B 10/80 | (2013.01) |
| H01L 25/16 | (2006.01) |

(52) U.S. Cl.
CPC ............ *G01J 1/4257* (2013.01); *G01J 1/44* (2013.01); *H04B 10/802* (2013.01); *H01L 25/167* (2013.01)

(58) Field of Classification Search
CPC ........................................................ G01J 1/42
USPC ............................. 250/200, 201.1, 551, 552
See application file for complete search history.

(56) References Cited

U.S. PATENT DOCUMENTS

| 4,114,177 A * | 9/1978 | King ................................ 257/81 |
| 4,857,746 A | 8/1989 | Kuhlmann et al. |
| 7,196,313 B2 | 3/2007 | Quinones et al. |
| 7,359,640 B2 | 4/2008 | Onde et al. |
| 7,410,305 B2 | 8/2008 | Ohe et al. |
| 7,439,533 B2 | 10/2008 | Kito et al. |
| 7,625,136 B2 | 12/2009 | Miyamae et al. |
| 7,628,547 B2 | 12/2009 | Miyamae |
| 7,973,998 B2 | 7/2011 | Xue |
| 8,097,868 B2 * | 1/2012 | Monaco et al. ............... 250/551 |
| 2010/0045924 A1 | 2/2010 | Powers et al. |
| 2010/0270483 A1 | 10/2010 | Omura |
| 2011/0140131 A1 | 6/2011 | Martiny et al. |
| 2012/0002264 A1 | 1/2012 | Xue |

FOREIGN PATENT DOCUMENTS

| CA | 1260742 | 9/1989 |
| JP | 2006/066614 | 3/2006 |

OTHER PUBLICATIONS

Bataista, Carlos et al., "Synthesis and Characterization of VO2-based Thermochromic Thin Films for Energy-Efficient Windows", *Nanoscale Research Letters* 2011.

(Continued)

*Primary Examiner* — David Porta
*Assistant Examiner* — Faye Boosalis

(57) ABSTRACT

Various embodiments of methods and devices are provided for an optocoupler comprising a layer of dielectric optically semi-reflective and transmissive material disposed between an LED and a first photodetector located above an upper surface of the layer, and a second photodetector located beneath the lower surface of the layer. The layer reflects a first portion of light generated by the LED towards the first photodetector to generate LED feedback control signals, and transmits a second portion of light generated by the LED through the layer for detection by the second photodetector to generate isolated output signals.

31 Claims, 4 Drawing Sheets

(56) References Cited

OTHER PUBLICATIONS

Dearmitt, Chris, "ThermoShift: New Thermo-Opaque Thermoplastics", *Phantom Plastics*, Unknown publication date. www.phantomplastics.com/attachments/File/ThermoShift_Article.pdf.
HCNR200 and HCNR201 High-Linearity Analog Optocouplers, Dec. 10, 2011.
Avago Technologies™ "6N135/6, HCNW135/6, HCPL-2502/0500/0501 Single Channel, High Speed Optocouplers," Jan. 29, 2010.
Avago Technologies™ HCPL-7710/0710 40 ns Propagation Delay CMOS Optocoupler, Jan. 4, 2008.
Avago Technologies™ "6N137, HCNW2601, HCNW2611, HCPL-0600, HCPL-0601, HCPL-0611, HCPL-0630, HCPL-0631, HCPL-0681, HCPL-2601, HCPL-2611, HCPL-2630, HCPL-2631, HCPL-4661 High CMR, High Speed TTL Compatible Optocouplers," Mar. 29, 2010.

* cited by examiner

OPTOCOUPLER WITH MULTIPLE PHOTODETECTORS AND IMPROVED FEEDBACK CONTROL OF LED

FIELD OF THE INVENTION

Various embodiments of the invention described herein relate to the field of optocouplers, and means and methods of providing smaller package size and LED feedback control thereof.

BACKGROUND

In electronics, an optocoupler, also known as an opto-isolator photocoupler, or optical isolator, is an electronic device that transfers electrical signals using light waves to provide coupling with electrical isolation between the input and output of the optocoupler. The main purpose of an optocoupler is to prevent high voltages or rapidly changing voltages on one side of the optocoupler from damaging components or distorting transmissions on the other side of the optocoupler. By way of example, some commercially available optocouplers are designed to withstand input-to-output voltages of up to 10 kV and voltage transients with speeds up to 10 kV/usec.

In an optocoupler, input and output sides of the device are connected with a beam of light (typically falling in the infra-red or near-infrared spectrum) modulated by input currents proportional to the electrical signals input to the device. The optocoupler transforms the input electrical signals into light, sends the corresponding light signals across a dielectric channel, captures the transmitted light signals on the output side of the optocoupler, and transforms the transmitted light signals back into output electric signals. Some optocouplers employ infrared or near-infrared light emitting diodes (LEDs) to transmit the light signals and photodetectors to detect the light signals and convert them into output electrical signals.

Some optocouplers include side-by-side closely matched photodetectors, where one the photodetectors is employed to monitor and stabilize the light output of the LED to reduce the effects of non-linearity, drift and aging of the LED, and the other photodetector is employed to generate output signals. See, for example, Avago Technologies™ "HCNR200 and HCNR201 High-Linearity Analog Optocouplers," Dec. 10, 2011, the Data Sheet for which is filed on even date herewith in an accompanying Information Disclosure Statement, the entirety of which is hereby incorporated by reference herein.

Many commercially available optocouplers are provided in standard 8-pin dual in-line (DIP) or other standard format packages. While in such packages feedback control and modulation of the LEDs disposed therein on the basis of the detected light signals is often desirable, doing so may require a package that is larger and has more complicated circuitry than is desired. Among other things, what is needed is an optocoupler package having improved feedback control capabilities that is smaller and features less complicated feedback control circuitry.

SUMMARY

In one embodiment, there is provided an optocoupler package comprising first and second input signal terminals, first and second output terminals, third and fourth output terminals, a layer of dielectric optically semi-reflective and trans-missive material having an upper surface and a lower surface, a light emitting diode (LED) operably connected to the first and second input signal terminals and configured to emit infrared or near-infrared light in proportion to at least one predetermined characteristic of the input signals, a first photodetector operably connected to the first and second output terminals and configured to provide LED feedback control signals thereacross, and a second photodetector operably connected to the third and fourth output terminals and configured to provide isolated output signals thereacross, wherein the LED and the first photodetector are both located above the upper surface of the layer of dielectric semi-reflective material, the second photodetector is located beneath the lower surface of the layer of dielectric semi-reflective material, and the layer of dielectric semi-reflective material is configured to reflect a first portion of light generated by the LED and incident upon the upper surface thereof towards the first photodetector thereby to provide the feedback control signals therefrom and to transmit a second portion of light generated by the LED through the upper and lower surfaces thereof for detection by the second photodetector thereby to provide the isolated output signals therefrom.

In another embodiment, there is provided a method of operating an optocoupler package comprising providing input signals across first and second input signal terminals of an LED included in the optocoupler package, generating and emitting, on the basis of the input signals, infrared or near-infrared light signals with the LED, reflecting a first portion of light generated by the LED and incident upon an upper surface of a layer of dielectric semi-reflective material towards a first photodetector thereby to generate and provide LED feedback control signals therefrom, the LED and the first photodetector being located above the upper surface, transmitting a second portion of light generated by the LED through the upper surface and an opposing lower surface of the layer of dielectric semi-reflective material towards a second photodetector thereby to generate and provide isolated output signals therefrom, the second photodetector being located beneath the lower surface.

Further embodiments are disclosed herein or will become apparent to those skilled in the art after having read and understood the specification and drawings hereof.

BRIEF DESCRIPTION OF THE DRAWINGS

Different aspects of the various embodiments will become apparent from the following specification, drawings and claims in which:

DETAILED DESCRIPTIONS OF SOME EMBODIMENTS

Figure 1:
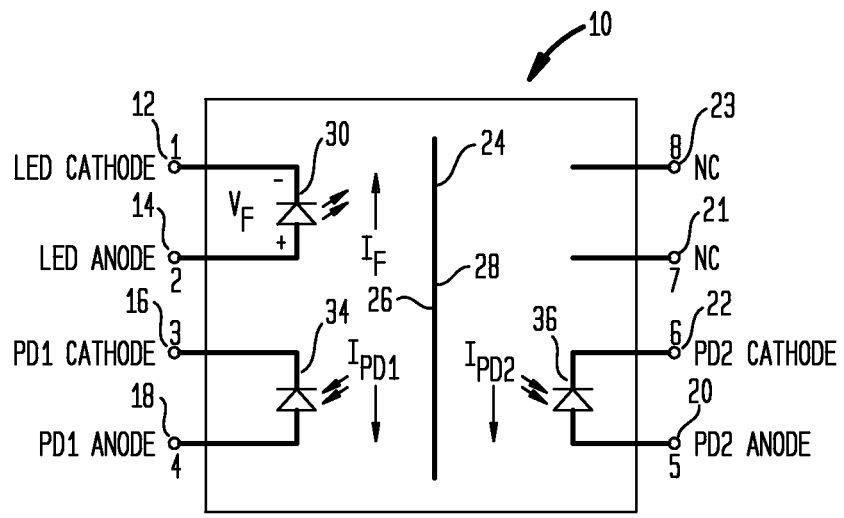
FIGS. 1 and 2 illustrate two different embodiments of schematic circuit diagrams of optocoupler 8-pin DIP packages that may be employed in accordance with the teachings set forth herein.
Figure 2:
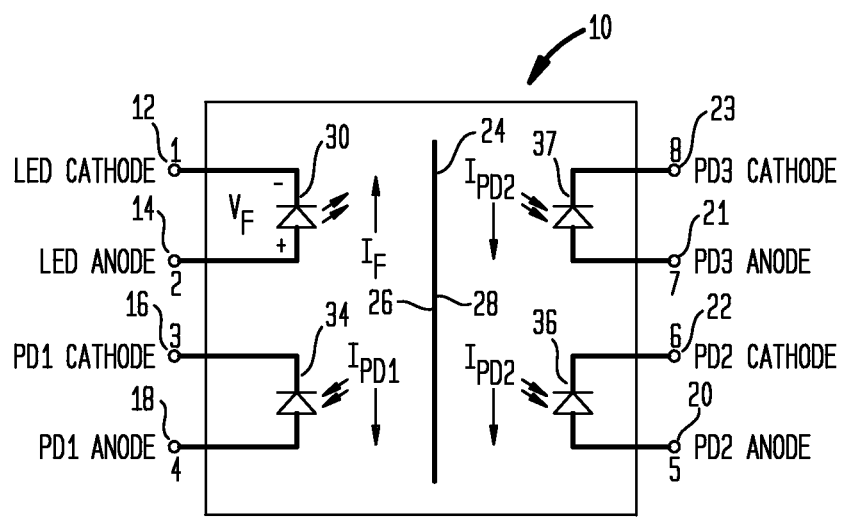

FIGS. 1 and 2 illustrate two different embodiments of schematic circuit diagrams of optocoupler 8-pin DIP packages that may be employed in accordance with the teachings set forth herein.

In FIG. 1, optocoupler package 10 comprises first and second input signal terminals 12 and 14 (pins 1 and 2, respectively), first and second output terminals 16 and 18 (pins 3 and 4, respectively), third and fourth output terminals 20 and 22 (pins 5 and 6, respectively), and layer 24 comprising a dielectric optically semi-reflective and transmissive material having upper surface 26 and lower surface 28. Light emitting diode (LED) 30 is operably connected to first and second input signal terminals 12 and 14 and is configured to emit infrared or near-infrared light in proportion to at least one predetermined characteristic of input signals received across first and second input signal terminals 12 and 14. First photodetector 34 is operably connected to first and second output terminals 16 and 18 and is configured to provide LED feedback control signals thereacross. Second photodetector 36 is operably connected to third and fourth output terminals 20 and 22 and is configured to provide isolated output signals thereacross.

Continuing to refer to FIG. 1, LED 30 and first photodetector 34 are both located above upper surface 26 of layer 24 of dielectric semi-reflective material. Second photodetector 36 is located beneath lower surface 28 of layer 24 of dielectric semi-reflective material. Layer 24 of dielectric semi-reflective material is configured to reflect a first portion of light generated by LED 30 and incident upon upper surface 26 of layer 24 towards first photodetector 34 thereby to provide LED feedback control signals therefrom. Layer 24 of dielectric semi-reflective material is further configured to transmit a second portion of light generated by LED 30 through upper and lower surfaces 26 and 28 of layer 24 for detection by second photodetector 36 to provide isolated output signals therefrom.

Referring now to FIG. 2, and in comparison to FIG. 1, there is included in optocoupler package 10 an additional third photodetector 37, which like photodetector 36 is configured to provide isolated output signals across the output terminals thereof (terminals 21 and 23, or pins 7 and 8).

Figure 3:
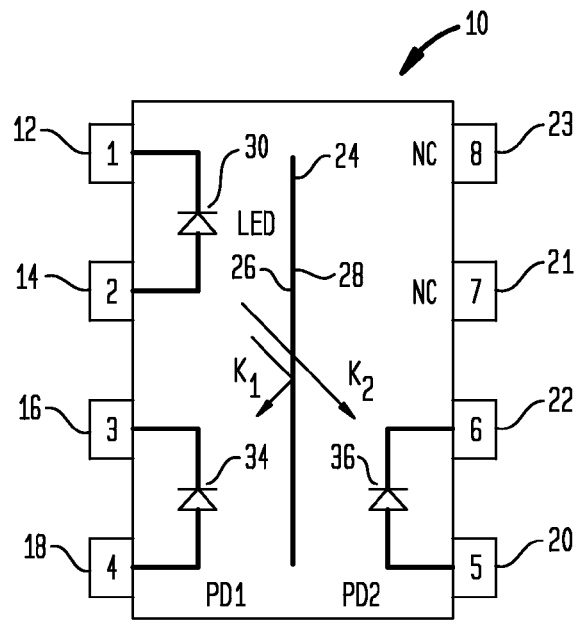
FIG. 3 shows an 8-layer DIP package configuration corresponding to the embodiment of the circuitry shown in FIG. 1.

FIG. 3 shows an 8-layer DIP package configuration corresponding to the embodiment of the circuitry shown in FIG. 1.

Figure 4:
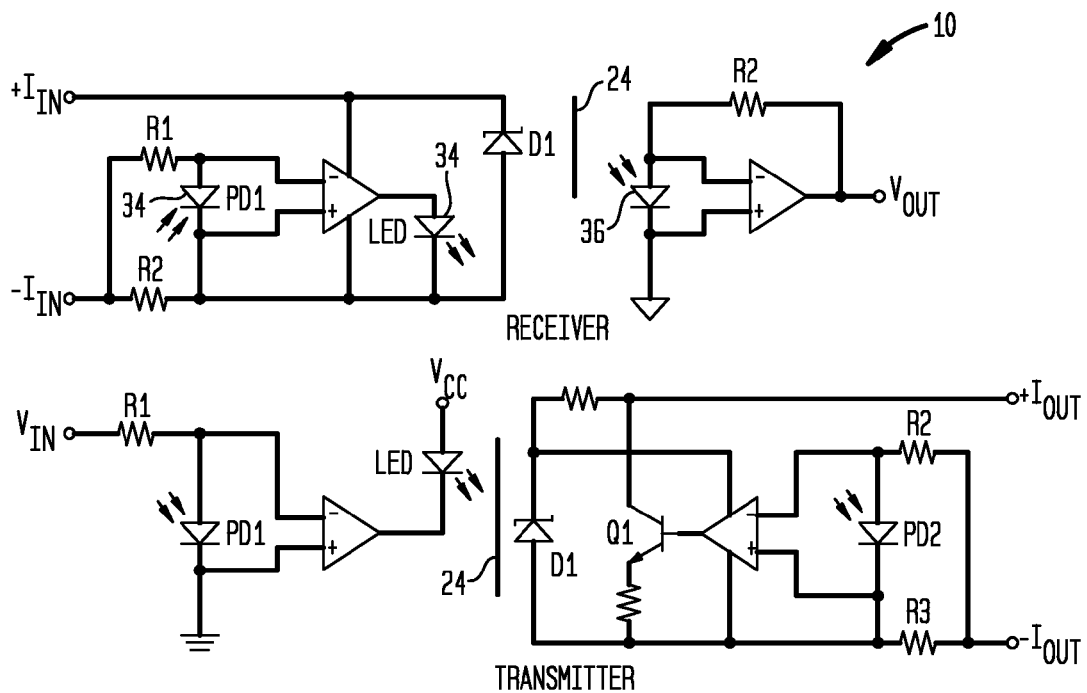
FIG. 4 shows a loop-powered 4-20 mA current loop circuit according to one embodiment of optocoupler package 10 disclosed herein.

FIG. 4 shows a loop-powered 4-20 mA current loop circuit according to one embodiment of optocoupler package 10 disclosed herein.

Figure 5:
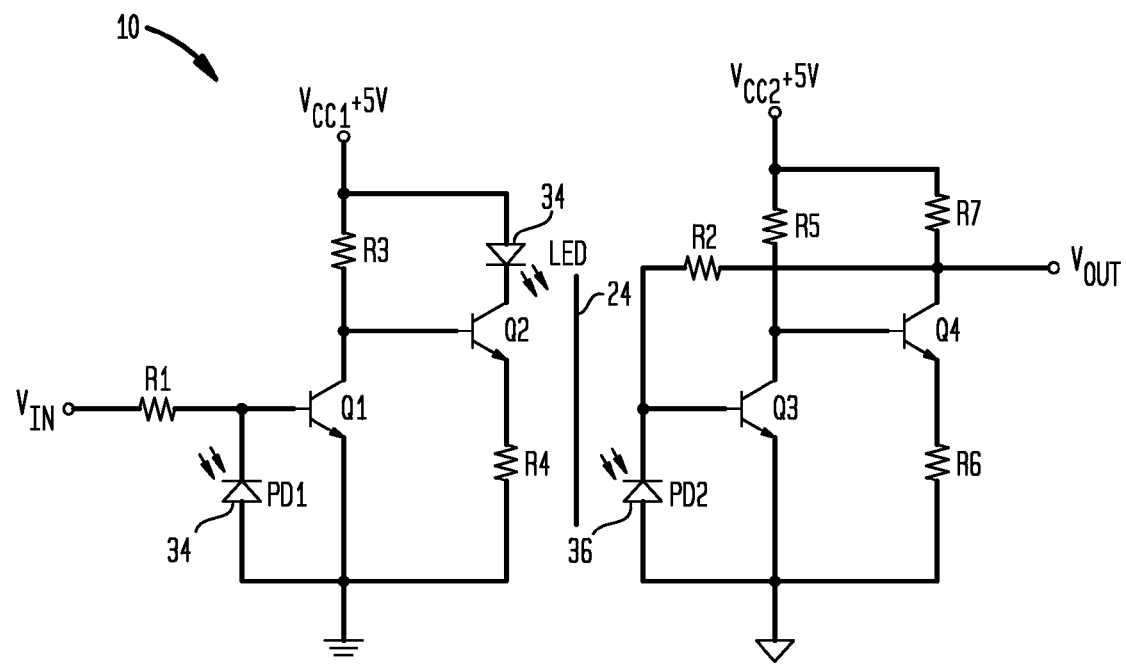
FIG. 5 shows a high-speed low-cost analog isolator according to one embodiment of optocoupler package 10 disclosed herein.

FIG. 5 shows a high-speed low-cost analog isolator according to one embodiment of optocoupler package 10 disclosed herein.

Figure 6:
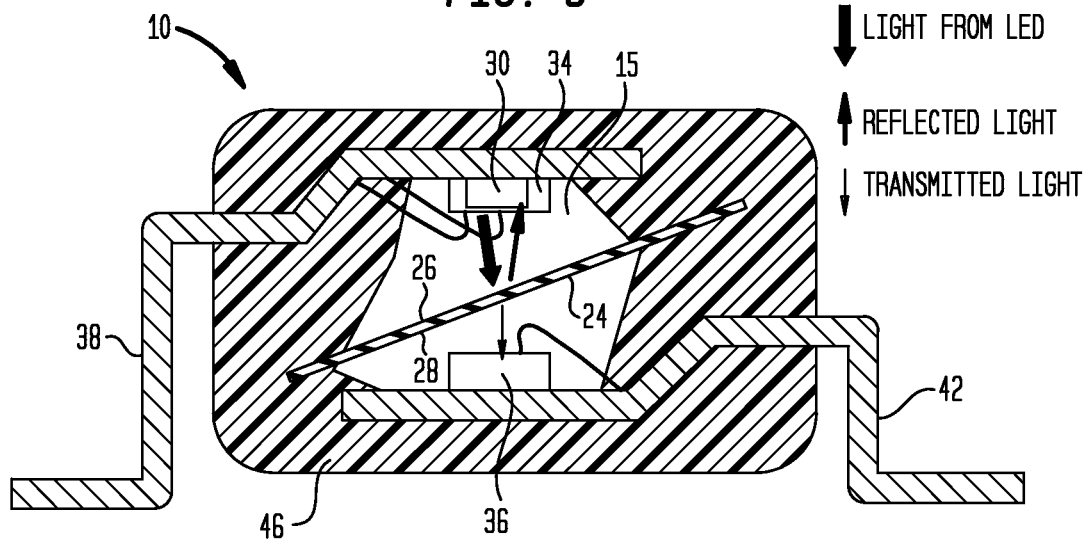
FIG. 6 shows a cross-sectional view according to one embodiment of optocoupler package 10.

FIG. 6 shows a cross-sectional view according to one embodiment of optocoupler package 10 comprising first input lead frame 38, second output lead frame 42, LED 30 mounted on first lead frame 38, first photodetector 34 mounted on first lead frame 38, second photodetector 36 mounted on second lead frame 42, and layer 24 disposed between inner portions of first and second lead frames 38 and 42, where layer 24 comprises a dielectric optically semi-reflective and transmissive material having upper surface 26 and lower surface 28. Light emitting diode (LED) 30 is operably connected to first and second input signal terminals (not shown in FIG. 6) disposed on first lead frame 38 and is configured to emit infrared or near-infrared light in proportion to at least one predetermined characteristic of input signals received across the first and second input signal terminals. First photodetector 34 is mounted on first lead frame 38 operably connected to first and second output terminals (not shown in FIG. 6) and is configured to provide LED feedback control signals thereacross. Second photodetector 36 is mounted on second lead frame 42 and is operably connected to third and fourth output terminals (not shown in FIG. 6) and is configured to provide isolated output signals thereacross.

Continuing to refer to FIG. 6, LED 30 and first photodetector 34 are both located above upper surface 26 of layer 24 of dielectric semi-reflective material. Second photodetector 36 is located beneath lower surface 28 of layer 24 of dielectric semi-reflective material. Layer 24 of dielectric semi-reflective material is configured to reflect a first portion of light generated by LED 30 and incident upon upper surface 26 of layer 24 towards first photodetector 34 thereby to provide LED feedback control signals therefrom. Layer 24 of dielectric semi-reflective material is further configured to transmit a second portion of light generated by LED 30 through upper and lower surfaces 26 and 28 of layer 24 for detection by second photodetector 36 to provide isolated output signals therefrom.

In the various embodiments of optocoupler package 10, the first, second or third photodetector may be a photo diode, a bipolar detector transistor, or a Darlington detector transistor. LED 30 may be an AlGaAs LED, an ACE AlGaAs LED, a DPUP AlGaAs LED, or a GaAsP LED. As shown in FIG. 6, optocoupler package 10 may also comprise a molding compound 46 that at least partially surrounds or encases a plurality of terminals 12, 14, 16, 18, 20, 22, 21 or 23 and portions of layer 24 of dielectric optically semi-reflective and transmissive material. Molding compound 46 may comprise, by way of example, plastic or any other suitable material. In one embodiment, optocoupler package 10 is an 8-pin DIP package, although other packaging configurations are certainly contemplated.

With respect to layer 24 of dielectric optically semi-reflective and transmissive material, such layer may be at least partially polymeric, and may further be a film, such as a multi-layer optical film. One example of such a film is a selective wavelength mirror multi-layer optical film, where the film comprises between about 100 layers and about 1,000 layers. The layers may range between about 10 nanometers and about 200 nanometers in thickness. One example of a material that may be adapted to be employed for layer 24 is 3M™ Cool Mirror Film 330™, which is an all-polymeric film that features low light reflectivity at normal incidence and high light reflectivity at high angles of incidence. Thus, angles of incidence upon layer 24, and the relative positions of LED 30 and photodetectors 34 and 36, may be configured and optimized such that desired first portions of light are reflected towards first photodetector 34 and desired second portions of light are transmitted to second photodetector 36.

As described above, the LED feedback control signals provided by first photodetector 34 may be employed to regulate and control the output of LED 30. The at least one predetermined characteristic of the input signals employed to modulate light emitted by LED 30 may include one or more of input signal amplitude, phase and frequency.

Referring now to FIGS. 1, 2, 3, 4, 5 and 6, according to some embodiments there are also provided corresponding methods of operating an optocoupler package 10 comprising providing input signals across first and second input signal terminals 12 and 14 of LED 30, generating and emitting, on the basis of the input signals, infrared light signals with LED 30, reflecting a first portion of light generated by LED 30 and incident upon upper surface 26 of layer 24 of dielectric semi-reflective material towards first photodetector 34 thereby to generate and provide LED feedback control signals therefrom, where LED 30 and first photodetector 34 are located above upper surface 26, transmitting a second portion of light generated by LED 30 through upper surface 26 and opposing lower surface 28 of layer 24 of dielectric semi-reflective material towards second photodetector 36 thereby to generate and provide isolated output signals therefrom, where second photodetector 36 is located beneath lower surface 28.

Various optocouplers and optocoupler packages known in the art may be adapted for use in accordance with the above teachings. Examples of such optocouplers and optocoupler packages include, but are not limited to: (a) Avago Technologies™ "6N135/6, HCNW135/6, HCPL-2502/0500/0501 Single Channel, High Speed Optocouplers," Jan. 29, 2010; (b) Avago Technologies™ HCPL-7710/0710 40 ns Propagation Delay CMOS Optocoupler," Jan. 4, 2008; and (c) Avago Technologies™ "6N137, HCNW2601, HCNW2611, HCPL-0600, HCPL-0601, HCPL-0611, HCPL-0630, HCPL-0631, HCPL-0661, HCPL-2601, HCPL-2611, HCPL-2630, HCPL-2631, HCPL-4661 High CMR, High Speed TTL Compatible Optocouplers," Mar. 29, 2010; the respective Data Sheets for which are filed on even date herewith in an accompanying Information Disclosure Statement and which are hereby incorporated by reference herein, each in its respective entirety.

Figure 7:
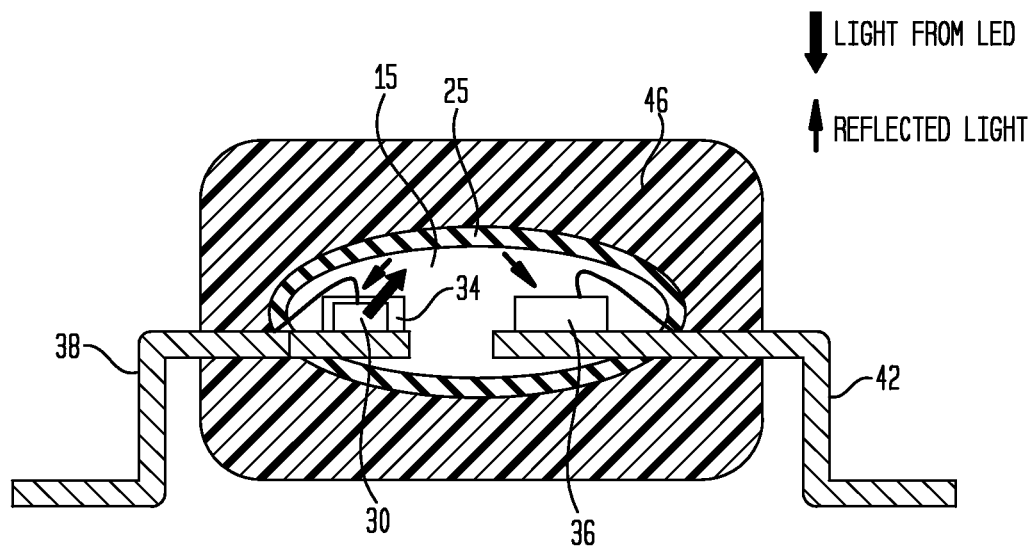
FIG. 7 shows one embodiment of optocoupler 10 package in a planar configuration.

FIG. 7 shows one embodiment of optocoupler 10 package in a planar configuration where no layer 24 is employed to reflect and transmit light emitted by LED 30, and where reflective layer 25 is configured to reflect first and second portions of light emitted by LED 30 towards photodetector 34 and photodetector 34. According to one embodiment, layer 25 is formed of a reflective white silicone material. Reflective layer 25 or portions thereof may be shaped, formed and configured such that predetermined first and second amounts of light are apportioned by way of reflection to first and second photodetectors 34 and 36. Such apportionment may be accomplished through the use of steps, ridges or other optically focusing, reflecting or directing features formed into reflective layer 25 at appropriate locations with respect to first and second photodetectors 34 and 36, as those skilled in the art will now readily realize and appreciate. In addition, the inner recess of package 10 within which LED 30 and photodetectors 34 and 36 are disposed may be filled with a clear silicone material.

The above-described embodiments should be considered as examples of the present invention, rather than as limiting the scope of the invention. In addition to the foregoing embodiments of the invention, review of the detailed description and accompanying drawings will show that there are other embodiments of the present invention. Accordingly, many combinations, permutations, variations and modifications of the foregoing embodiments of the present invention not set forth explicitly herein will nevertheless fall within the scope of the present invention.

We claim:

1. An optocoupler package, comprising:
   first and second input signal terminals;
   first and second output terminals;
   third and fourth output terminals;
   a layer of dielectric optically semi-reflective and transmissive material having an upper surface and a lower surface;
   a light emitting diode (LED) operably connected to the first and second input signal terminals and configured to emit infrared or near-infrared light in proportion to at least one predetermined characteristic of the input signals;
   a first photodetector operably connected to the first and second output terminals and configured to provide LED feedback control signals thereacross, and
   a second photodetector operably connected to the third and fourth output terminals and configured to provide isolated output signals thereacross;
   wherein the LED and the first photodetector are both located above the upper surface of the layer of dielectric semi-reflective material, the second photodetector is located beneath the lower surface of the layer of dielectric semi-reflective material, and the layer of dielectric semi-reflective material is configured to reflect a first portion of light generated by the LED and incident upon the upper surface thereof towards the first photodetector thereby to provide the feedback control signals therefrom and to transmit a second portion of light generated by the LED through the upper and lower surfaces thereof for detection by the second photodetector thereby to provide the isolated output signals therefrom.

2. The optocoupler of claim 1, wherein the LED and the first photodetector are operably connected to a first lead frame.

3. The optocoupler of claim 2, wherein the first lead frame comprises the first and second input signal terminals and the first and second output terminals.

4. The optocoupler of claim 1, wherein the second photodetector is operably connected to a second lead frame.

5. The optocoupler of claim 4, wherein the second lead frame comprises the third and fourth output terminals.

6. The optocoupler of claim 1, wherein at least one of the first and second photodetectors is a photo diode, a bipolar detector transistor, and a Darlington detector transistor.

7. The optocoupler of claim 1, wherein the LED is one of an AlGaAs LED, an ACE AlGaAs LED, a DPUP AlGaAs LED, and a GaAsP LED.

8. The optocoupler of claim 1, wherein the optocoupler further comprises a molding compound that at least partially surrounds or encases a plurality of the terminals and portions of the layer of dielectric optically semi-reflective and transmissive material.

9. The optocoupler of claim 8, wherein the molding compound comprises plastic.

10. The optocoupler of claim 1, wherein the optocoupler is an 8-pin DIP package.

11. The optocoupler of claim 1, wherein the layer of dielectric optically semi-reflective and transmissive material is at least partially polymeric.

12. The optocoupler of claim 1, wherein the layer of dielectric optically semi-reflective and transmissive material is a film.

13. The optocoupler of claim 12, wherein the film is at least partially polymeric.

14. The optocoupler of claim 13, wherein the at least partially polymeric film is a multi-layer optical film.

15. The optocoupler of claim 14, wherein the multi-layer optical film is a selective wavelength mirror multi-layer optical film.

16. The optocoupler of claim 12, wherein the film comprises between about 100 layers and about 1,000 layers.

17. The optocoupler of claim 16, wherein each of the layers ranges between about 10 nanometers and about 200 nanometers in thickness.

18. The optocoupler of claim 1, wherein the LED feedback control signals are employed to regulate and control the output of the LED.

19. The optocoupler of claim 1, wherein the at least one predetermined characteristic includes at least one of input signal amplitude, phase and frequency.

20. A method of operating an optocoupler package, comprising:
providing input signals across first and second input signal terminals of an LED included in the optocoupler package;
generating and emitting, on the basis of the input signals, infrared or near-infrared light signals with the LED;
reflecting a first portion of light generated by the LED and incident upon an upper surface of a layer of dielectric semi-reflective material towards a first photodetector thereby to generate and provide LED feedback control signals therefrom, the LED and the first photodetector being located above the upper surface;
transmitting a second portion of light generated by the LED through the upper surface and an opposing lower surface of the layer of dielectric semi-reflective material towards a second photodetector thereby to generate and provide isolated output signals therefrom, the second photodetector being located beneath the lower surface.

21. The method of claim 20, wherein at least one of the first and second photodetectors is a photo diode, a bipolar detector transistor, and a Darlington detector transistor.

22. The method of claim 20, wherein the LED is one of an AlGaAs LED, an ACE AlGaAs LED, a DPUP AlGaAs LED, and a GaAsP LED.

23. The method of claim 20, wherein the optocoupler is an 8-pin DIP package.

24. The method of claim 20, wherein the layer of dielectric optically semi-reflective and transmissive material is at least partially polymeric.

25. The method of claim 20, wherein the layer of dielectric optically semi-reflective and transmissive material is a film.

26. The method of claim 25, wherein the film is at least partially polymeric.

27. The method of claim 26, wherein the at least partially polymeric film is a multi-layer optical film.

28. The method of claim 27, wherein the multi-layer optical film is a selective wavelength mirror multi-layer optical film.

29. The method of claim 25, wherein the film comprises between about 100 layers and about 1,000 layers.

30. The method of claim 29, wherein each of the layers ranges between about 10 nanometers and about 200 nanometers in thickness.

31. The method of claim 20, further comprising regulating and controlling the output of the LED using the LED feedback control signals.

* * * * *